United States Patent
Ahn et al.

(10) Patent No.: US 7,919,396 B2
(45) Date of Patent: Apr. 5, 2011

(54) METHOD OF FABRICATING AN ORGANIC THIN FILM TRANSISTOR

(75) Inventors: Taek Ahn, Suwon-si (KR); Min-Chul Suh, Suwon-si (KR); Yeon-Gon Mo, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 103 days.

(21) Appl. No.: 12/318,915

(22) Filed: Jan. 12, 2009

(65) Prior Publication Data
US 2009/0170291 A1 Jul. 2, 2009

(51) Int. Cl.
*H01L 21/20* (2006.01)
*H01L 21/36* (2006.01)

(52) U.S. Cl. .............................. 438/478; 438/149

(58) Field of Classification Search ............... 438/149, 438/478, 142, 147, 163; 257/E21.09, E21.19, 257/40, 59, 72
See application file for complete search history.

(56) References Cited

U.S. PATENT DOCUMENTS

| | | | |
|---|---|---|---|
| 5,500,537 A | 3/1996 | Tsumura et al. | |
| 6,060,338 A | 5/2000 | Tanaka et al. | |
| 6,080,606 A | 6/2000 | Gleskova et al. | |
| 6,500,604 B1 | 12/2002 | Dimitrakopoulo et al. | |
| 6,740,900 B2 * | 5/2004 | Hirai ........................ | 257/40 |
| 6,913,944 B2 | 7/2005 | Hirai | |
| 2002/0155729 A1 | 10/2002 | Baldwin et al. | |
| 2003/0047729 A1 | 3/2003 | Hirai et al. | |
| 2003/0059984 A1 | 3/2003 | Sirringhaus et al. | |
| 2003/0211649 A1 | 11/2003 | Hirai et al. | |
| 2003/0226996 A1 | 12/2003 | Aramaki et al. | |
| 2004/0079833 A1 | 4/2004 | Romagnoli | |
| 2004/0124410 A1 | 7/2004 | Lee et al. | |
| 2005/0009248 A1 | 1/2005 | Weng et al. | |

(Continued)

FOREIGN PATENT DOCUMENTS
EP    1 006 587    6/2000

(Continued)

OTHER PUBLICATIONS

Office action from Japanese Patent Office issued in Applicant's corresponding Japanese Patent Application No. 2006-141932 dated Nov. 24, 2009, and Request for Entry of the Accompanying Office Action for the Japanese Office action attached herewith.

(Continued)

*Primary Examiner* — Kenneth A Parker
*Assistant Examiner* — Anthony Ho
(74) *Attorney, Agent, or Firm* — Robert E. Bushnell, Esq.

(57) ABSTRACT

An organic thin film transistor that prevents the surface of an organic semiconductor layer from being damaged and reduces turn-off current, a method of fabricating the same, and an organic light-emitting device incorporating the organic thin film transistor. The organic thin film transistor includes a substrate, source and drain electrodes arranged on the substrate, a semiconductor layer contacting the source and drain electrodes and comprising a channel region, a protective film arranged on the semiconductor layer and having a same pattern as the semiconductor layer, the protective film comprising a laser-absorbing material, a gate insulating film arranged between the gate and the source and drain electrodes, a gate electrode arranged on the gate insulating film and a separation pattern arranged within the semiconductor layer and within the protective film, the separation pattern adapted to define the channel region of the semiconductor layer.

11 Claims, 14 Drawing Sheets

U.S. PATENT DOCUMENTS

| | | | |
|---|---|---|---|
| 2005/0258487 A1* | 11/2005 | Suh et al. | 257/347 |
| 2005/0269562 A1* | 12/2005 | Yang et al. | 257/40 |
| 2006/0099526 A1 | 5/2006 | Yang | |
| 2006/0186410 A1* | 8/2006 | Ahn et al. | 257/59 |

FOREIGN PATENT DOCUMENTS

| | | |
|---|---|---|
| EP | 1 369 936 | 12/2003 |
| EP | 1 657 751 | 5/2006 |
| JP | 2003-092410 | 3/2003 |
| JP | 2004-179478 | 6/2004 |
| JP | 2005-051199 | 2/2005 |
| KR | 10-2004-0028010 | 4/2004 |
| KR | 10-2004-0084427 | 10/2004 |
| WO | WO 99/03157 | 1/1999 |
| WO | WO 02/095805 | 11/2002 |
| WO | WO 2004/079833 | 9/2004 |

OTHER PUBLICATIONS

An article "Fast Organic Circuits on Flexible Polymeric Substrates" written by Sheraw, et al., published in Electron Devices Meeting, 2000, IEDM Technical Digest, pp. 619-622 on Dec. 10, 2000.

An article "Low driving voltages and memory effect in organic thin-film transistors with a ferroelectric gate insulator" written by Velu, et al., published in Applied Physics Letters, American Institute of Physics, Melville, NY, US, vol. 79, No. 5, pp. 659-661 on Jul. 30, 2001.

European Search Report of the European Patent Application No. 06 11 4389, issued on Sep. 26, 2006.

An article "Printed Plastic electronics and Paperlike Displays" written by Rogers, et al., published in Journal of Polymer Science: Part A: Polymer Chemistry, vol. 40, No. 20, Oct. 15, 2002, New York, NY, US.

European Search Report for European Patent Application No. 06 11 4389, issued on Jul. 25, 2006.

* cited by examiner

METHOD OF FABRICATING AN ORGANIC THIN FILM TRANSISTOR

CLAIM OF PRIORITY AND CROSS-REFERENCE TO RELATED APPLICATION

This application makes reference to, incorporates the same herein, and claims all benefits accruing under 35 U.S.C. §119 from an application earlier filed in the Korean Intellectual Property Office on 24 May 2005 and there duly assigned Serial No. 10-2005-0043702. Furthermore, this application claims all benefits accruing under 35 U.S.C. §120 from Applicants' Ser. No. 11/436,531 filed in the U.S. Patent & Trademark Office on 19 May 2006 and issued as U.S. Pat. No. 7,495,252 on Feb. 24, 2009, and assigned to the assignee of the present invention.

BACKGROUND OF THE INVENTION

1. Field of the Invention

The present invention relates to a thin film transistor for flat panel displays, and more particularly, to an organic thin film transistor that prevents the surface of an organic semiconductor layer from being damaged, and a flat panel display having the same.

2. Description of the Related Art

Studies on organic thin film transistors (OTFTs) for use in next generation display devices have been actively performed. OTFTs use an organic film instead of a silicon film as a semiconductor layer, and are classified into low molecule organic thin film transistors such as using oligothiophene and pentacene, and polymer organic thin film transistors such as polythiophene, according to the material that forms the organic film.

An organic electro-luminescence display device that uses an organic thin film transistor as a switching device includes at least two organic thin film transistors, for example, one switching organic thin film transistor and one driving organic thin film transistor, one capacitor, and an organic light emitting diode having an organic film layer interposed between upper and lower electrodes.

Typically, a flexible organic electro-luminescence display device uses a flexible substrate that includes a plastic substrate. The organic electro-luminescence display device that uses the plastic substrate has to be manufactured by a low temperature process since the plastic substrate has very low thermal stability.

Accordingly, an organic thin film transistor that uses an organic film as a semiconductor layer has been largely considered as an alternative for the switching device of the flexible organic electro-luminescence display device since the organic thin film transistor can be manufactured at low temperatures.

A pentacene thin film transistor that can reduce the thin film deposition time and improve the hole mobility has been disclosed in Korean Patent Laid-Open No. 2004-0028010. A device structure of an organic thin film transistor and a method of fabricating the organic thin film transistor that can improve the electrical performance of the transistor have been disclosed in Korean Patent Publication No. 2002-0084427. Also, a thin film transistor that can improve carrier mobility and on/off current ratio by incorporating a channel region into an organic compound having a radical has been disclosed in Japanese Laid-Open Patent No. 2003-92410.

An organic thin film transistor having a top gate structure includes a gate electrode formed on a substrate, a gate insulating film formed on the substrate, and source and drain electrodes formed on the gate insulating film, and a semiconductor layer formed on the source and drain electrodes and on the gate insulating film. In such an organic thin film transistor, the semiconductor layer is an unpatterned organic semiconductor layer formed on the entire surface of the substrate. As a result, there is a leakage current problem due to the accumulation of carriers, such as holes, between the semiconductor layer and the gate insulating film. To solve the above problem, the organic semiconductor layer can be patterned by laser ablation. However, laser ablation causes thermal deformation or recasting at edge portions of the patterned semiconductor layer. What is therefore needed is an improved structure and an improved method of making that overcomes the above problems so that there is no leakage current while having no thermal deformation or recasting.

SUMMARY OF THE INVENTION

It is therefore an object of the present invention to provide an improved design for an organic thin film transistor.

It is also an object of the present invention to provide an improved design for a flat panel display employing the novel thin film transistor.

It is also an object of the present invention to provide a novel method of making the novel organic thin film transistor.

It is also an object of the present invention to provide a method of fabricating an organic thin film transistor where an organic semiconductor layer can be patterned without causing surface damage to the organic semiconductor layer.

It is also an object of the present invention to provide an organic electro-luminescence display device having an organic thin film transistor in which an organic semiconductor layer is patterned.

It is further an object of the present invention to provide an organic thin film transistor and a flat panel display using the same and a method of making the organic thin film transistor where the organic semiconductor layer can be patterned without damaging the organic semiconductor layer while preventing leakage current from occurring while preventing thermal deformation and preventing recasting.

According to an aspect of the present invention, there is provided a thin film transistor including a substrate, source and drain electrodes arranged on the substrate, a semiconductor layer contacting the source and drain electrodes and comprising a channel region, a protective film arranged on the semiconductor layer and having a same pattern as the semiconductor layer, the protective film comprising a laser-absorbing material, a gate electrode arranged on the substrate, a gate insulating film arranged between the gate and the source and drain electrodes, and a separation pattern arranged within the semiconductor layer and within the protective film, the separation pattern adapted to define the channel region of the semiconductor layer.

The semiconductor layer can be an organic semiconductor layer, the gate insulating film can be one of a mono-layered film and a multi-layered film, the mono-layered film and layers within the multi-layered film being one of an organic film, an inorganic film, and an organic-inorganic hybrid film. The protective film can be thinner than the semiconductor layer, and can have a thickness of 10 to 1000 Å. The protective film can include an aromatic group material. The protective film can include a fluoride-based polymer. The gate insulating film can include a high dielectric constant (high-k) material such as $Ta_2O_5$, $Y_2O_3$, $TiO_2$, barium strontium titanate (BST), lead zirconate titanate (PZT), and barium zirconate titanate (BZT). The protective film can include an insulating film comprising a material selected from the group consisting of silicon oxide, silicon nitride, polyvinyl alcohol (PVA), polyvinyl chloride (PVC), poly methylmethacrylate (PMMA), polyimide, parylene, polyvinyl phenol (PVP), PI/Al$_2$O$_3$, and a photosensitive material.

According to another aspect of the present invention, there is provided a method of fabricating a thin film transistor which includes providing a thin film transistor that comprises gate, source and drain electrodes and a semiconductor layer, forming the semiconductor layer on a substrate, forming a protective film on the semiconductor layer and patterning the semiconductor layer and the protective film to define a channel region of the semiconductor layer via laser ablation.

The protective film can be thinner than the semiconductor layer and can have a thickness of 10 to 1000 Å. The protective film can include a fluoride-based polymer, and the gate insulating film can include a high dielectric constant (high-k) material such as Ta$_2$O$_5$, Y$_2$O$_3$, TiO$_2$, barium strontium titanate (BST), lead zirconate titanate (PZT), and barium zirconate titanate (BZT). The gate, the gate insulating film, and the source and drain electrodes can be formed prior to the forming of the semiconductor layer. The source and drain electrodes can be formed before forming the semiconductor layer, the semiconductor layer can then be patterned, and then the gate insulating film and the gate electrode can be formed. The semiconductor layer and the protective film can be patterned to be line-shaped or box-shaped to define the channel region of the semiconductor layer.

According to yet another aspect of the present invention, there is provided a flat panel display including a thin film transistor arranged on a substrate and comprising gate, source and drain electrodes, and a semiconductor layer having a channel region, a display device comprising a plurality of pixel electrodes connected to the thin film transistor, an gate insulating film arranged between the gate and the source and drain electrodes of the thin film transistor and a protective film arranged on the semiconductor layer and having a pattern identical to a pattern of the semiconductor layer, the pattern of the protective film being adapted to define the channel region of the semiconductor layer, the protective film comprising a laser-absorbing material.

The protective film can be thinner than that of the semiconductor layer and can have a thickness of 10 to 1000 Å. The protective film can include an aromatic group material. The protective film can include a fluoride-based polymer. The gate insulating film can include a high dielectric constant (high-k) material such as Ta$_2$O$_5$, Y$_2$O$_3$, TiO$_2$, barium strontium titanate (BST), lead zirconate titanate (PZT), and barium zirconate titanate (BZT). The semiconductor layer and the protective film each can include either a groove-shaped separation pattern adapted to define the channel region, a line-shaped pattern, a box-shaped pattern, or a mesh-shaped pattern. The protective film can include an insulating film comprising a material selected from the group consisting of silicon oxide, silicon nitride, polyvinyl alcohol (PVA), polyvinyl chloride (PVC), poly methylmethacrylate (PMMA), polyimide, parylene, polyvinyl phenol (PVP), PI/Al$_2$O$_3$, and a photosensitive material.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
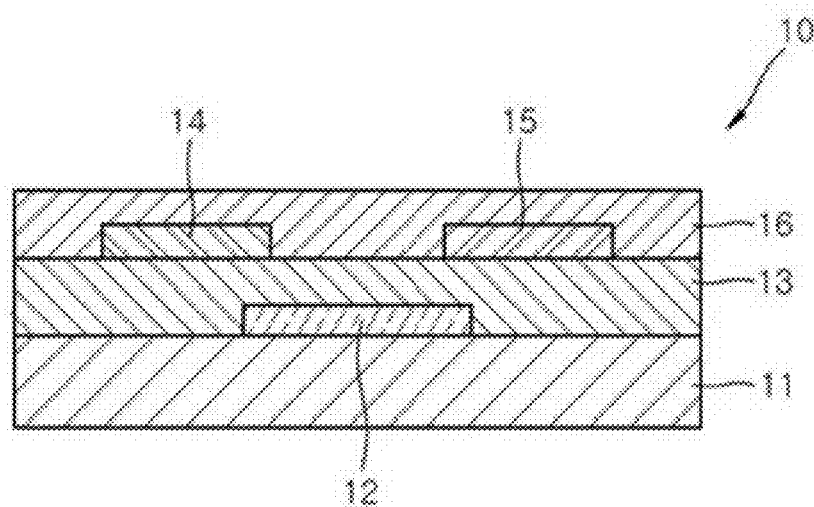
FIG. 1 is a cross-sectional view of an organic thin film transistor.

Turning now to the figures, FIG. 1 is a cross-sectional view of an organic thin film transistor 10 having a top gate structure. Referring to FIG. 1, the organic thin film transistor 10 includes a gate electrode 12 formed on a substrate 11, a gate insulating film 13 formed on the substrate 11, source and drain electrodes 14 and 15 formed on the gate insulating film 13, and a semiconductor layer 16 formed on the source and drain electrodes 14 and 15 and on the gate insulating film 13.

Figure 2:
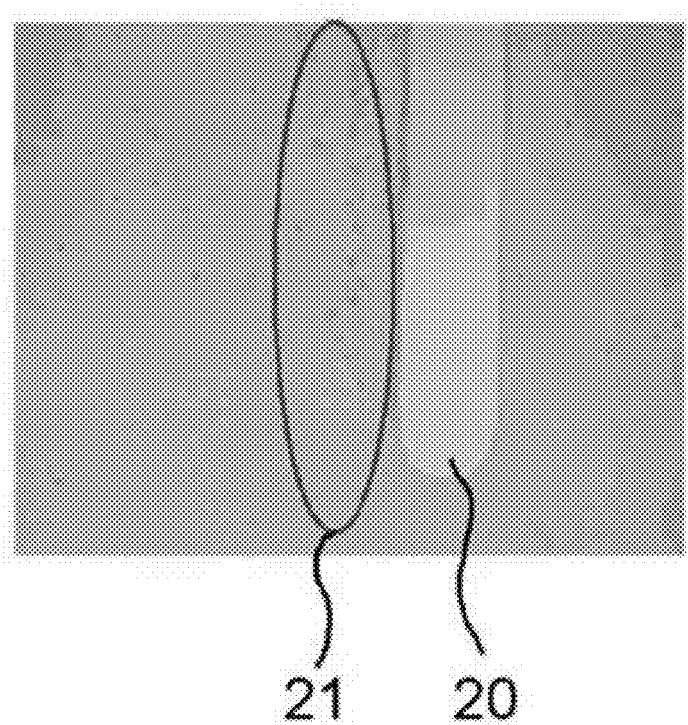
FIG. 2 is a U.S. Patent drawing derived from a scanning electron microscope (SEM) image showing the surface damage of an organic semiconductor layer in an organic thin film transistor when the organic semiconductor layer is patterned via laser ablation.

In the organic thin film transistor 10 having the above structure, the semiconductor layer 16 is an unpatterned organic semiconductor layer formed on the entire surface of the substrate 11. As a result, there is a problem of a leakage current due to the accumulation of carriers, such as holes, between the semiconductor layer 16 and the gate insulating film 13. To solve the above problem, the organic semiconductor layer can be patterned by laser ablation as depicted in FIG. 2. However, laser ablation causes thermal deformation or recasting at edge portions 21 of the patterned semiconductor layer.

Figure 3:
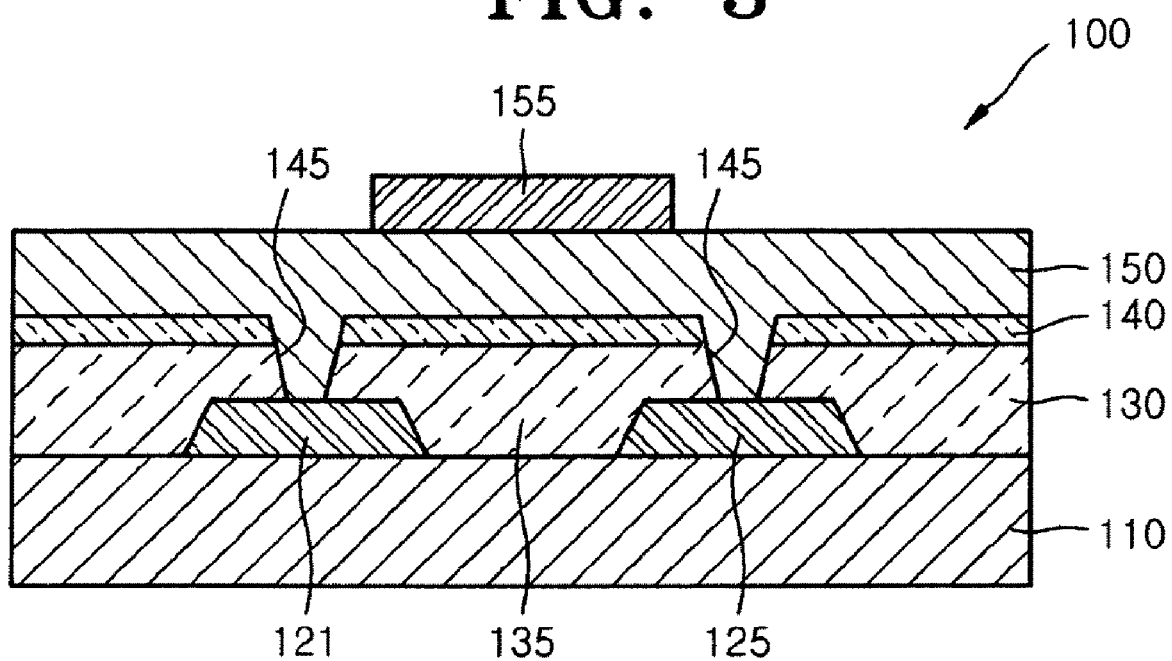
FIG. 3 is a cross-sectional view illustrating an organic thin film transistor according to a first embodiment of the present invention.

Turning now to FIG. 3, FIG. 3 is a cross-sectional view illustrating an organic thin film transistor 100 according to a first embodiment of the present invention. The organic thin film transistor 100 of FIG. 3 is a top-gate type structure. Referring to FIG. 3, source and drain electrodes 121 and 125 are formed on a substrate 110. A semiconductor layer 130 is formed on the substrate 110 and the source and drain electrodes 121 and 125 to contact the source and drain electrodes 121 and 125, and a protective film 140 is formed on the semiconductor layer 130. A gate insulating film 150 is formed on the protective film 140. A gate electrode 155 is formed on the gate insulating film 150 to correspond to a channel region 135 of the semiconductor layer 130 disposed between the source and drain electrodes 121 and 125. The substrate 110 can be one of a glass substrate, a plastic substrate, and a metal substrate. The metal substrate can be formed of steel use stainless (SUS). The plastic substrate can include a plastic film such as polyethersulphone (PES), polyacrylate (PAR), polyetherimide (PEI), polyethyelene napthalate (PEN), polyethyeleneterepthalate (PET), polyphenylene sulfide (PPS), polyallylate, polyimide, polycarbonate (PC), cellulose triacetate (TAC), and cellulose acetate propinonate (CAP).

The semiconductor layer 130 is an organic semiconductor layer. The semiconductor layer 130 includes an organic film such as pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyplorene and its derivatives, polythiopenevinylene and its derivatives, polythiophene-hetero ring aromatic copolymer and its derivatives, oligoacen of naphthalene and its derivatives, alpha-5-thiophene oligothiophene and its derivatives, phthalocianin that does not include a metal and its derivatives, phyromeliticdianhydride and its derivatives, phyromelitic diimid and its derivatives, perrylenetetracarboxy acid dianhydride and its derivatives, naphthalene tetracarboxylic acid diimid and its derivatives, and naphthalene tetracarboxylic acid dianhydride and its derivatives.

The gate insulating film 150 can have one or more layers, each layer being either an organic insulating film, an inorganic insulating film or an organic-inorganic hybrid film. Examples of inorganic insulating films that can be used in the gate insulating film 150 are $SiO_2$, SiNx, $Al_2O_3$, $Ta_2O_5$, barium strontium titanate (BST), lead zirconate titanate (PZT). In addition, the gate insulating film 150 includes one or more organic insulating films made out of polystyrene (PS), phenol-based polymer, acryl-based polymer, imide-based polymer such as polyimide, arylether-based polymer, amide-based polymer, fluoride-based polymer, p-zylene-based polymer, vinyl alcohol-based polymer or parylene.

The protective film 140 can be an organic insulating film, an inorganic insulating film, or an organic-inorganic hybrid film. The organic insulating film can be made out of an optical absorption material including an aromatic group material among materials used for forming the gate insulating film 150. The protective film 140 can be thinner than the semiconductor layer 130. Preferably, the protective film 140 can have a thickness of 10 to 1000 Å. The protective film 140 is made out one or more of silicon oxide, silicon nitride, polyvinyl alcohol (PVA), polyvinyl chloride (PVC), poly methylmethacrylate (PMMA), polyimide, parylene, polyvinyl phenol (PVP), $PI/Al_2O_3$, and a photosensitive material.

The protective film 140 can be made out of a fluoride-based polymer, which does not have a significant effect on the semiconductor layer 130. Since the fluoride-based polymer has a low dielectric constant, the gate insulating film 150 can be made out of a material having a high dielectric constant (high-k). The gate insulating film 150 can be a high-k inorganic insulating film such as $Ta_2O_5$, $Y_2O_3$, $TiO_2$, barium strontium titanate (BST), lead zirconate titanate (PZT), and barium zirconate titanate (BZT).

The organic thin film transistor 100 includes a separation pattern 145 formed in the semiconductor layer 130 and in the protective film 140. The channel region 135 of the semiconductor layer 130, which is disposed between the source and drain electrodes 121 and 125, and is separated by the separation pattern 145, acts as a channel layer of the organic thin film transistor 100. The separation pattern 145 has a groove shape and separates the channel region 135 from adjacent channel layers of the organic thin film transistor.

Turning now to FIGS. 4A through 4D, FIGS. 4A through 4D are plan views of various separation pattern designs formed in the semiconductor layer 130 of the organic thin film transistor 100 of FIG. 3. FIGS. 4A through 4D illustrate a thin film transistor, which is connected to a gate line 101 and a data line 103, among thin film transistors forming a single pixel in an organic electro-luminescence display. The present embodiment describes thin film transistors in a pixel, but the present invention is not limited thereto. That is, the present invention can be applied to thin film transistors used in an organic electro-luminescence display.

Figure 4A:
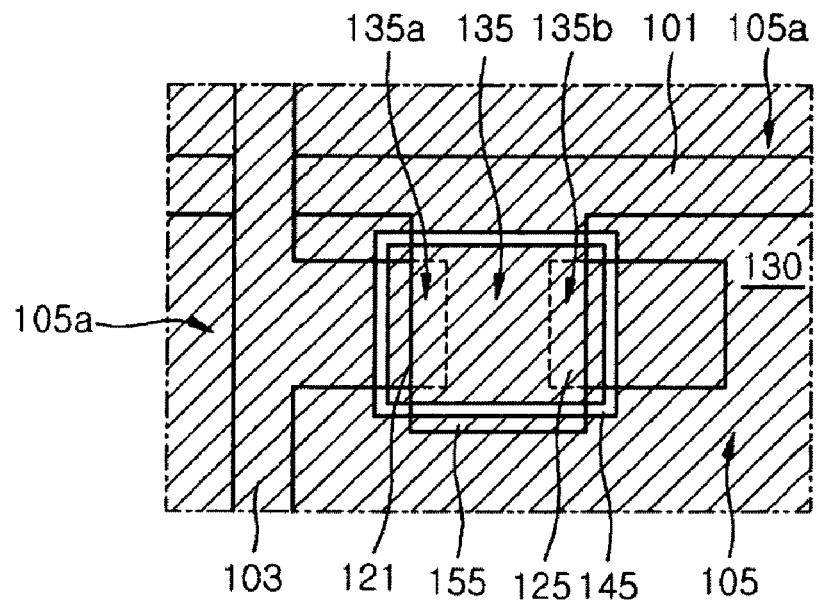
FIGS. 4A through 4D are plan views of a separation pattern disposed on an organic semiconductor layer of the organic thin film transistor of FIG. 3.

Referring to FIG. 4A, the separation pattern 145 includes a closed loop shaped groove surrounding the channel region 135, and arranged in a pixel region 105 defined by the gate line 101 and the data line 103. The separation pattern 145 separates the channel region 135 from adjacent thin film transistors (not illustrated) arranged in an adjacent pixel region 105a. Reference numbers 135a and 135b denote contacting regions where the channel region 135 in the semiconductor layer 130 contacts the source and drain electrodes 121 and 125, respectively. When a plurality of thin film transistors are arranged in a single pixel region, the separation pattern 145 can be formed for each pixel region or for each thin film transistor arranged in the single pixel region. The separation pattern 145 can be formed to be superimposed with the gate line 101 or the data line 103, being outside of the corresponding pixel region 105. The separation pattern 145 can be formed over an adjacent pixel region 105a.

Figure 4B:
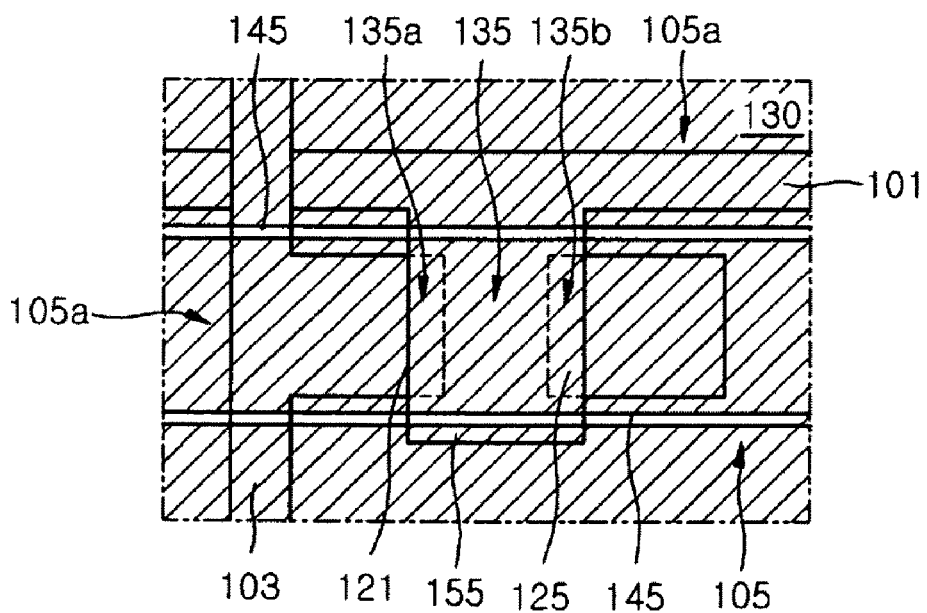

Referring now to FIG. 4B, the separation pattern 145 includes a pair of parallel line grooves extending along the gate line 101 so that the channel region 135 is disposed between the pair of parallel line grooves and separated from a thin film transistor (not illustrated) arranged in an adjacent pixel region 105a. When a plurality of thin film transistors are arranged in a single pixel region, the separation pattern 145 can be formed for each pixel region or for each thin film transistor arranged in the single pixel region. The pair of parallel line grooves, which corresponds to the separation pattern 145, can extend along the gate line 101 from the corresponding pixel region 105 over to an adjacent pixel region 105a so that the channel region 135 can be separated from the thin film transistor arranged in the adjacent pixel region 105a.

Figure 4C:
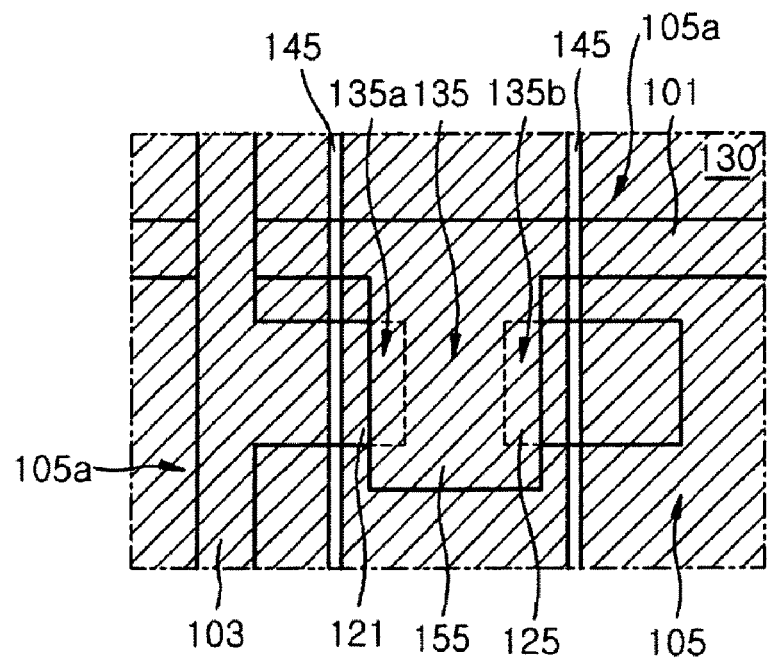

Referring now to FIG. 4C, the separation pattern 145 includes a pair of parallel line grooves extending along the data line 103 so that the channel region 135 is disposed between the pair of parallel line grooves and separated from a thin film transistor (not illustrated) arranged in the adjacent pixel region 105a. When a plurality of thin film transistors are arranged in a single pixel region, the separation pattern 145 can be formed for each pixel region or for each thin film transistor arranged in the single pixel region. The pair of parallel line grooves, which corresponds to the separation pattern 145, can extend along the data line 103 from the corresponding pixel region 105 over to an adjacent pixel region 105a so that the channel region 135 can be separated from the thin film transistor arranged in the adjacent pixel region 105a.

Figure 4D:
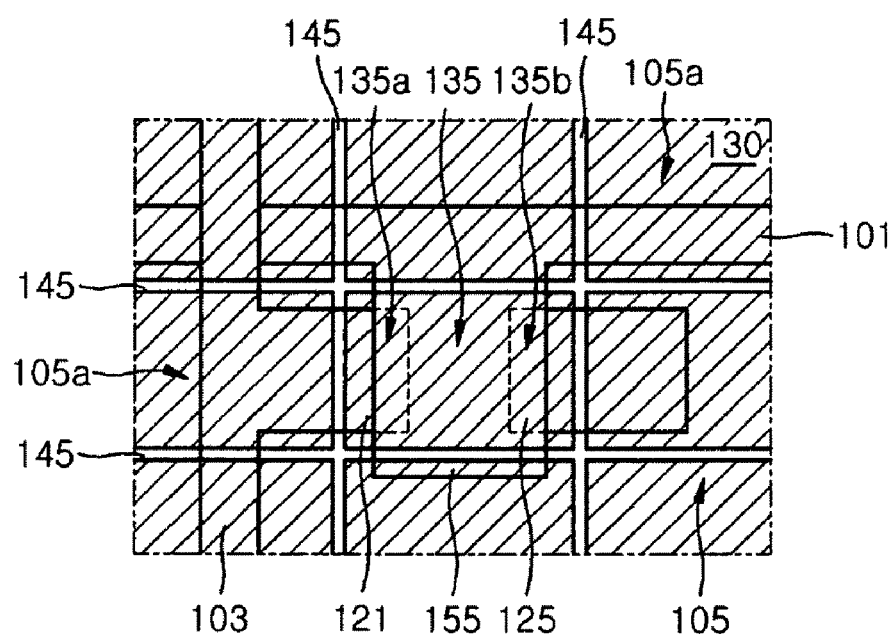

Referring now to FIG. 4D, the separation pattern 145 includes two pairs of parallel line grooves extending along the gate line 101 and the data line 103, respectively, and crossing each other. The separation pattern 145 separates the channel region 135, which is disposed between the two pairs of parallel line grooves, from adjacent thin film transistors (not illustrated) arranged in the adjacent pixel region 105a. When a plurality of thin film transistors are arranged in a single pixel region, the separation pattern 145 can be formed corresponding to each pixel region or to each thin film transistor arranged in a single pixel region. The two pairs of parallel line grooves, which correspond to the separation pattern 145, can extend along the gate line 101 and the data line 103, respectively, from the corresponding pixel region 105 over to an adjacent pixel region 105a so that the channel region 135 can be separated from the thin film transistor arranged in the adjacent pixel region 105a.

In the present embodiment, the groove-shaped separation pattern 145 is formed by completely etching through the semiconductor layer 130 and the protective film 140 to expose a portion of the source and drain electrodes 121 and 125, but the present invention is not limited thereto. For example, the groove-shaped separation pattern 145 can be formed by etching the semiconductor layer 130 to a predetermined thickness. In addition, the separation pattern 145 in FIGS. 4A through 4D separates the channel layers of the thin film transistors respectively arranged in the pixel regions 105 and 105a adjacent to each other, but the present invention is not limited thereto. For example, the separation pattern 145 can separate channel layers of a plurality of thin film transistors arranged in a single pixel region.

Figure 5A:
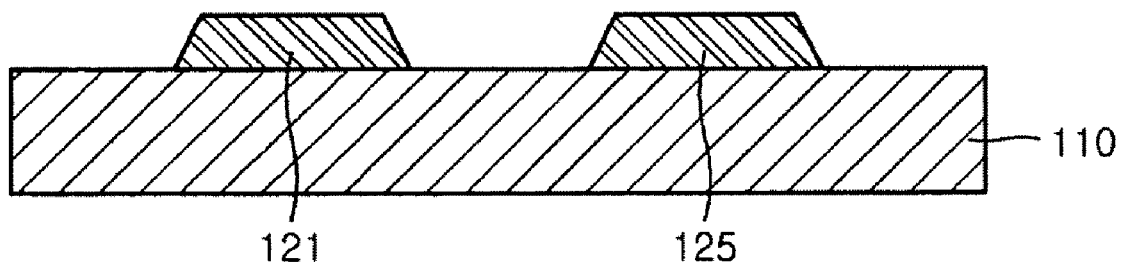
FIGS. 5A through 5D are cross-sectional views for explaining a method of fabricating the organic thin film transistor of FIG. 3.

Turning now to FIGS. 5A through 5D, FIGS. 5A through 5D are cross-sectional views for explaining a method of fabricating the organic thin film transistor 100 of FIG. 3. In the method, the semiconductor layer 130 is patterned using a laser ablation process. Referring to FIG. 5A, the source and drain electrodes 121 and 125 are formed on the substrate 110. The substrate 110 can be one of a glass substrate, a plastic substrate, and a metal substrate.

Figure 5B:
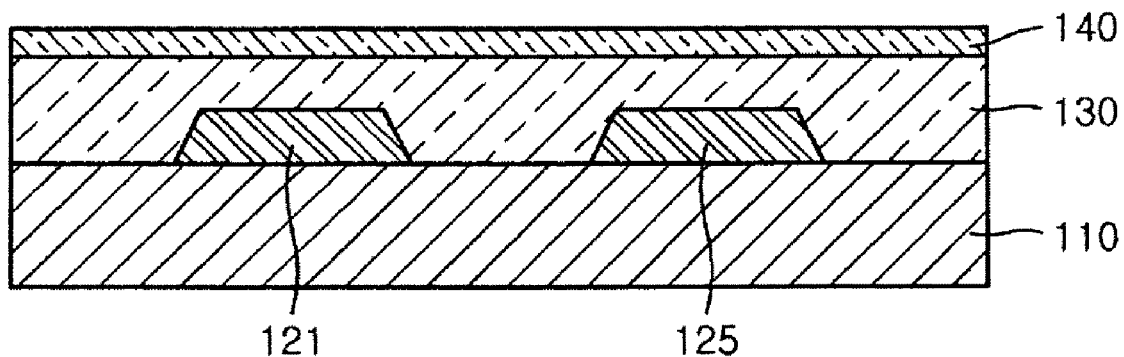

Referring now to FIG. 5B, the semiconductor layer 130 is formed on the substrate 110 and on the source and the drain electrodes 121 and 125, and the protective film 140 is formed on the semiconductor layer 130. The semiconductor layer 130 is an organic semiconductor layer. The protective film 140 can be an organic insulating film, an inorganic insulating film, or an organic-inorganic hybrid film. The protective film 140 prevents surface damage of to semiconductor layer 130 when the semiconductor layer 130 is patterned using a laser ablation process.

Figure 5C:
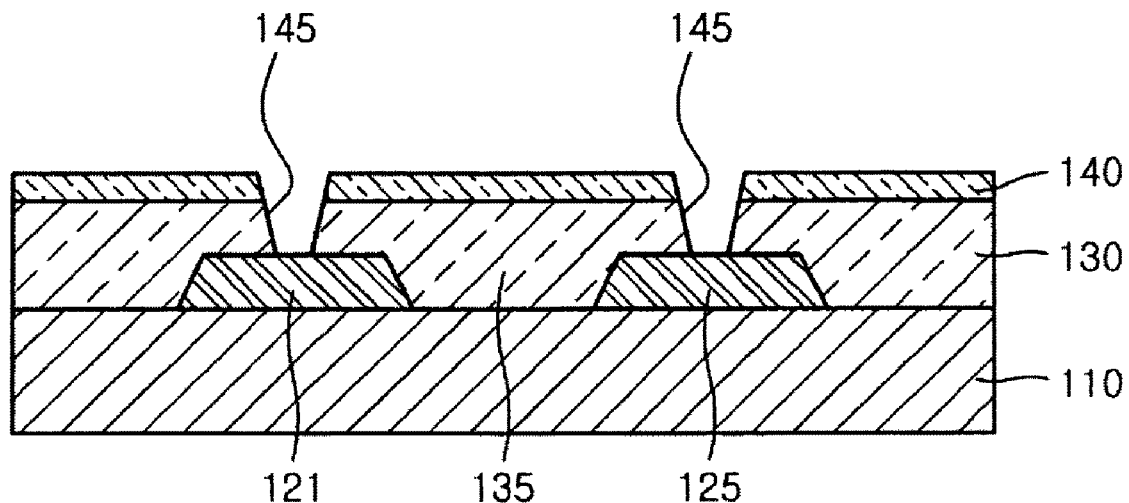

Referring now to FIG. 5C, the protective film 140 and the semiconductor layer 130 are etched using the laser ablation process to form a separation pattern 145 separating out the channel region 135 of the semiconductor layer 130. The separation pattern 145 has a groove shape, as illustrated in FIG. 4A through 4D. The semiconductor layer 130 is capped with the protective film 140 in preparation for the laser ablation process, and the protective film 140 is formed to have the same pattern as the semiconductor layer 130.

The protective film 140 is formed to be thinner than the semiconductor layer 130. The protective film has a thickness of less than 1000 Å, for example, 10 to 1000 Å. If the protective film 140 is thicker than the semiconductor layer 130, for example, if the semiconductor layer has a thickness of 500 to 1500 Å and the protective film 140 has a thickness of 1 to 2 µm, when patterning the semiconductor layer 130 using a laser ablation process, a large quantity of particles are generated.

The protective film 140 can include an organic insulating film, an inorganic insulating film or an organic-inorganic hybrid film. Since the separation pattern 145 is formed using the laser ablation process, the protective film 140 can be made out of an optical absorption material. For example, the protective film 140 can include an insulating film made out of one or more of silicon oxide, silicon nitride, polyvinyl alcohol (PVA), polyvinyl chloride (PVC), poly methylmethacrylate (PMMA), polyimide, parylene, polyvinyl phenol (PVP) and PI/Al$_2$O$_3$. The protective film 140 can also include negative or positive photosensitive material.

Figure 5D:
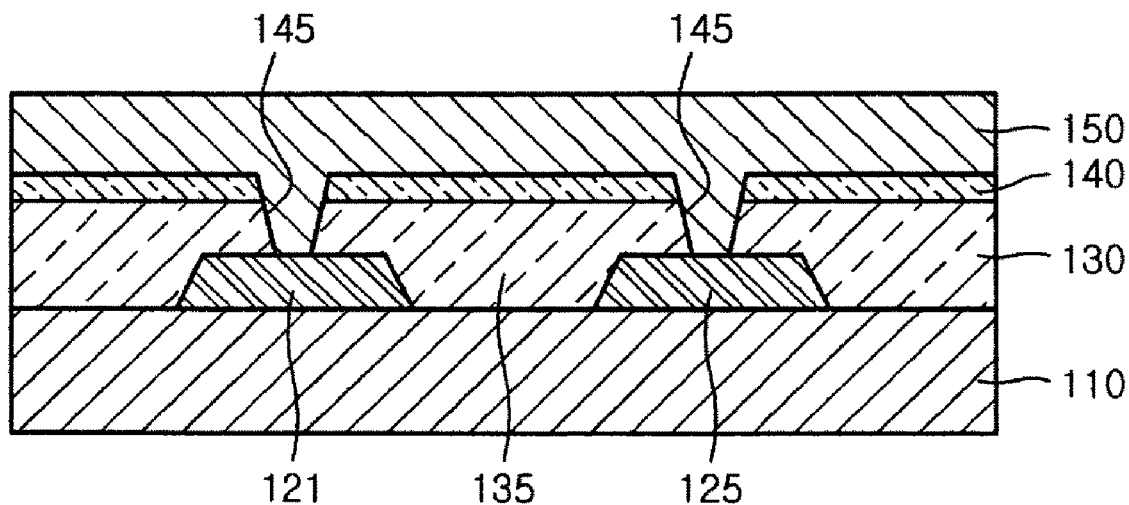

Referring now to FIG. 5D, the gate insulating film 150 is formed on the protective film 140 having the separation pattern 145. Next, the gate electrode 155 is formed on the gate insulating film 150, thus producing the organic thin film transistor 100 of the first embodiment.

The gate insulating film 150 can have one or more layers, each layer being either an organic insulating film, an inorganic insulating film or an organic-inorganic hybrid film. An inorganic layer in the gate insulating film 150 can be one of SiO$_2$, SiNx, Al$_2$O$_3$, Ta$_2$O$_5$, barium strontium titanate (BST), lead zirconate titanate (PZT). In addition, an organic layer in the gate insulating film 150 can include one or more of polystyrene (PS), phenol-based polymer, acryl-based polymer, imide-based polymer such as polyimide, arylether-based polymer, amide-based polymer, fluoride-based polymer, p-zylene-based polymer, vinyl alcohol-based polymer, and parylene.

In the first embodiment of the present invention, when the gate insulating film 150 or the protective film 140 include an organic material, since the separation pattern 145 separating out the channel region 135 of the semiconductor layer 130 is formed through the semiconductor layer 130 and the protective film 140, the protective film 140 should be formed of an organic material including an aromatic material that absorbs light. Since the gate insulating film 150 is formed after forming the separation pattern 145, the gate insulating film 150 may or may not be an organic material that absorbs light. When the protective film 140 includes a fluoride-based polymer having a low dielectric constant, the gate insulating film 150 can include a high-k inorganic insulating film such as Ta$_2$O$_5$, Y$_2$O$_3$, TiO$_2$, barium strontium titanate (BST), lead zirconate titanate (PZT), and barium zirconate titanate (BZT).

Figure 6:
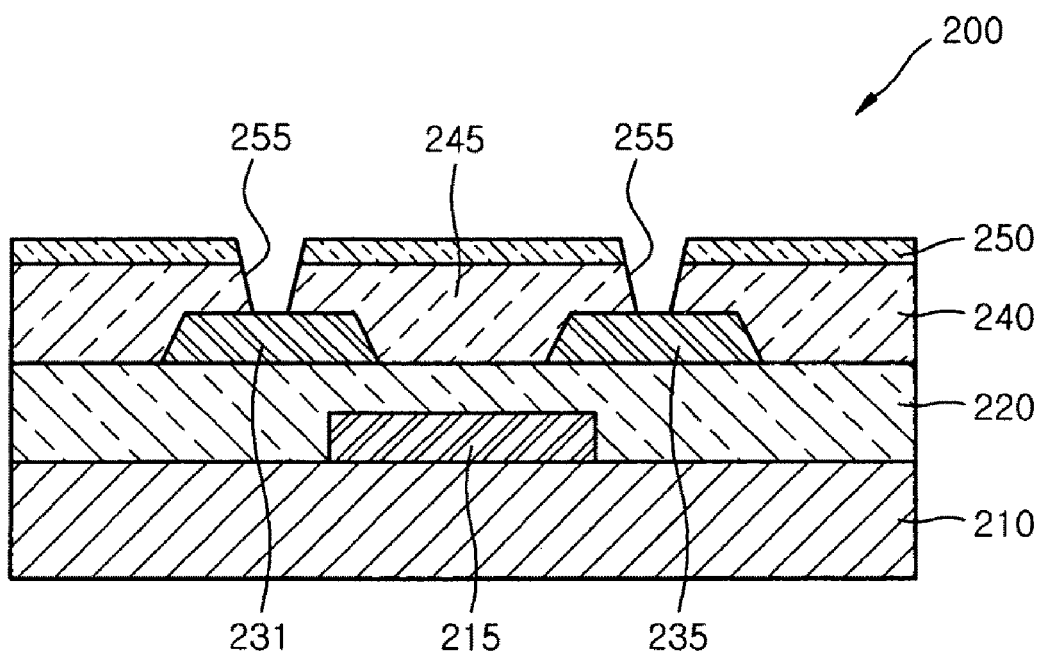
FIG. 6 is a cross-sectional view illustrating an organic thin film transistor according to a second embodiment of the present invention.

Turning now to FIG. 6, FIG. 6 is a cross-sectional view of an organic thin film transistor 200 used in a flexible organic electro-luminescence display according to a second embodiment of the present invention. The organic thin film transistor 200 of FIG. 6 is a bottom gate type structure. Referring to FIG. 6, a gate 215 is formed on a substrate 210, and a gate insulating film 220 is formed on the substrate 210 covering the gate 215. Source and drain electrodes 231 and 235 are formed on the gate insulating film 220. A semiconductor layer 240 is formed on the gate insulating film 220 to contact the source and drain electrodes 231 and 235. A protective film 250 is formed on the semiconductor layer 240.

The substrate 210 can be one of a glass substrate, a plastic substrate, and a metal substrate. The semiconductor layer 240 is an organic semiconductor layer. The gate insulating film 220 can have one or more layers, each layer being either an organic insulating film, an inorganic insulating film and an organic-inorganic hybrid film. The protective film 250 absorbs light, and can be an organic insulating film, an inorganic insulating film, or an organic-inorganic hybrid film.

The protective film 250 is formed to be thinner than the semiconductor layer 240, and has a thickness of less than 1000 Å, for example, 10 to 1000 Å.

The organic thin film transistor 200 includes a separation pattern 255 formed in the semiconductor layer 240 and in the protective film 250. A channel region 245 of the semiconductor layer 240, which is disposed between the source and drain electrodes 231 and 235, is separated out by the separation pattern 255 and serves as a channel layer of the organic thin film transistor 200. The separation pattern 255 separates the channel region 245 from adjacent channel layers of the organic thin film transistor and has a groove shape, as illustrated in FIGS. 4A through 4D.

The method of fabricating the organic thin film transistor 200 of FIG. 6 is similar to the method of fabricating the organic thin film transistor 100 illustrated in FIGS. 5A through 5D. The gate electrode 215, the gate insulating film 220, and the source and drain electrodes 231 and 235 are formed on the substrate 210. Next, the semiconductor layer 240 and the protective film 250 are formed over the resultant structure, and the separation pattern 255 is formed using a laser ablation process to pattern the semiconductor layer 240. According to the second embodiment, the protective film 250 is formed on the semiconductor layer 240, and then the semiconductor layer 240 is patterned using the laser ablation method so that surface damage of the semiconductor layer 240 can be avoided while avoiding carrier accumulation, thus reducing the turn-off current of the transistor.

Figure 7:
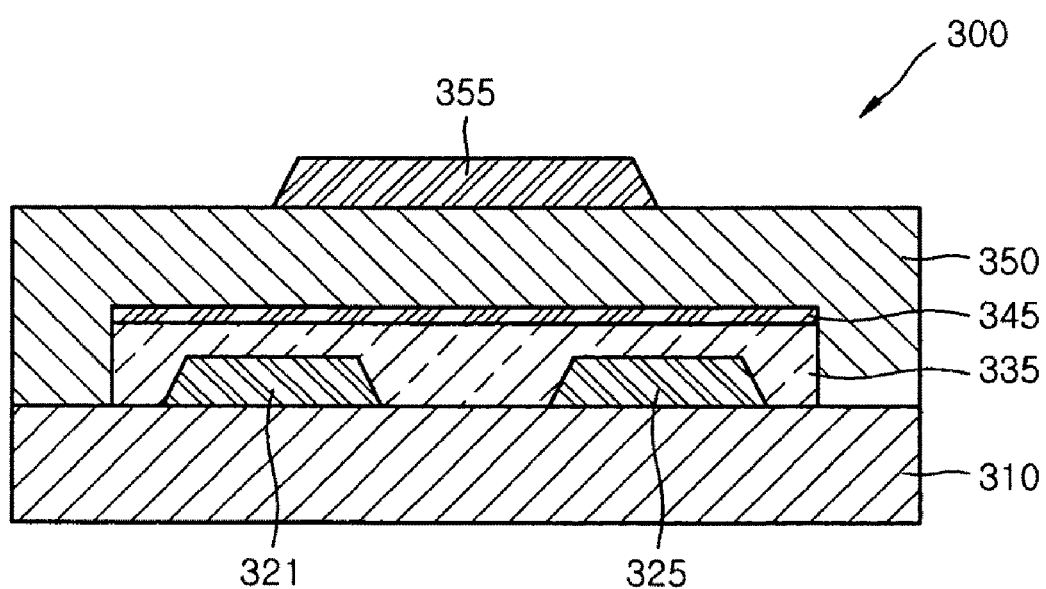
FIG. 7 is a cross-sectional view illustrating an organic thin film transistor according to a third embodiment of the present invention.

Turning now to FIG. 7, FIG. 7 is a cross-sectional view of an organic thin film transistor 300 according to a third embodiment of the present invention. The organic thin film transistor 300 is a top gate type structure similar to that of transistor 100 of FIG. 3. Referring to FIG. 7, source and drain electrodes 321 and 325 are formed on a substrate 310, and a semiconductor layer 335 is formed on the substrate 310 over and in contact with the source and drain electrodes 321 and 325 as well as between the source and drain electrodes 321 and 325. A protective film 345 is formed on the semiconductor layer 335. The protective film 345 and the semiconductor layer 335 are patterned to form the channel region. A gate insulating film 350 is formed on the resultant structure, and a gate electrode 355 is formed on the gate insulating film 350.

The substrate 310 can be one of a glass substrate, a plastic substrate or a metal substrate. The metal substrate can be formed of steel use stainless (SUS). The plastic substrate can include a plastic film such as polyethersulphone (PES), polyacrylate (PAR), polyetherimide (PEI), polyethyelene napthalate (PEN), polyethyeleneterepthalate (PET), polyphenylene sulfide (PPS), polyallylate, polyimide, polycarbonate (PC), cellulose tri-acetate (TAC) or cellulose acetate propinonate (CAP).

The semiconductor layer 335 is an organic semiconductor layer. The semiconductor layer 335 is an organic film such as pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyplorene and its derivatives, polythiopenevinylene and its derivatives, polythiophene-hetero ring aromatic copolymer and its derivatives, oligoacen of naphthalene and its derivatives, alpha-5-thiophene oligothiophene and its derivatives, phthalocianin that does not include a metal and its derivatives, phyromeliticdianhydride and its derivatives, phyromelitic diimid and its derivatives, perrylenetetracarboxy acid dianhydride and its derivatives, naphthalene tetracarboxylic acid diimid and its derivatives or naphthalene tetracarboxylic acid dianhydride and its derivatives.

The gate insulating film 350 can have one or more layers, each layer being either an organic insulating film, an inorganic insulating film or an organic-inorganic hybrid film. An inorganic insulating film in the gate insulating film 350 can be one of $SiO_2$, SiNx, $Al_2O_3$, $Ta_2O_5$, BST, and PZT. An organic insulating film in the gate insulating film 350 can be polystyrene (PS), phenol-based polymer, acryl-based polymer, imide-based polymer such as polyimide, arylether-based polymer, amide-based polymer, fluoride-based polymer, p-zylene-based polymer, vinyl alcohol-based polymer or parylene.

The protective film 345 includes either negative or positive photosensitive material. The protective film 345 is formed to be thinner than the semiconductor layer 335, and can have a thickness of less than 1000 Å, for example, 10 to 1000 Å. In the organic thin film transistor 300 of FIG. 7, the semiconductor layer 335 is patterned to correspond to the gate 355.

Turning now to FIGS. 8A through 8D, FIGS. 8A through 8D are plan views illustrating possible patterns for the semiconductor layer 335 in the organic thin film transistor 300 of FIG. 7 according to the third embodiment of the present invention. FIGS. 8A through 8D pertain to a single thin film transistor connected to a gate line 301 and a data line 303 among thin film transistors in a single pixel of an organic electro-luminescence display. The third embodiment is applied to a thin film transistor in a pixel, but the present invention is not limited thereto. For example, the third embodiment can also be applied to any thin film transistor used in an organic electro-luminescence display.

Figure 8A:
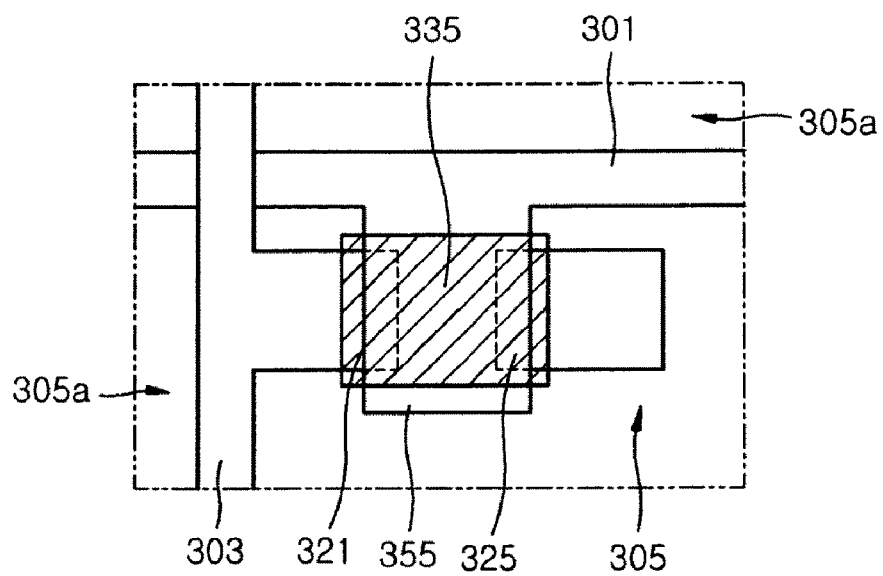
FIGS. 8A through 8D are plan views illustrating a pattern of an organic semiconductor layer in an organic thin film transistor of FIG. 7.

Referring now to FIG. 8A, the semiconductor layer 335 is respectively arranged for each pixel region 305 defined by the gate line 301, the data line 303, and a power supply line (not illustrated), and a box shaped pattern, which corresponds to the source and drain electrodes 321 and 325 and the space between the source and drain electrodes 321 and 325. When a plurality of thin film transistors are arranged in the pixel region 305, the semiconductor layer 335 has a box shaped pattern corresponding to each of the plurality of thin film transistors, or a box shaped pattern corresponding to the plurality of thin film transistors. The semiconductor layer 335 can be formed as a box shape to be superimposed with the gate line 301 or the data line 303, being outside of the corresponding pixel region 305. The semiconductor layer 335 can be formed over an adjacent pixel region 305a to separate a thin film transistor arranged in the adjacent pixel region 305a.

Figure 8B:
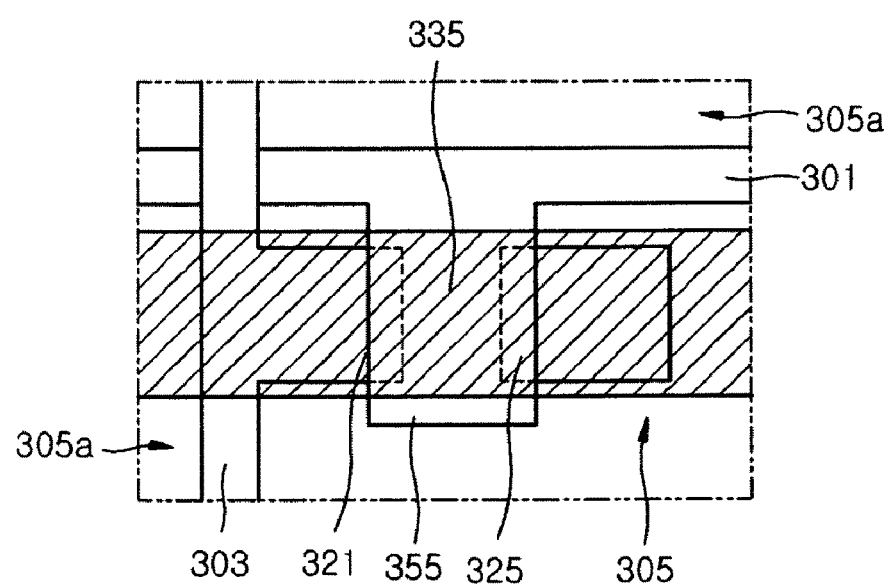

Referring now to FIG. 8B, the semiconductor layer 335 has a line shape extending along pixel regions arranged in a first direction, for example, in a row direction (left to right), among a plurality of pixel regions defined by the gate line 301 and the data line 303. The semiconductor layer 335 is separated from the thin film transistors arranged in pixel regions 305a arranged in an adjacent row among the plurality of pixel regions. When a plurality of thin film transistors are arranged in the pixel region, the semiconductor layer 335 has a line shaped pattern corresponding to each of the plurality of thin film transistors, or a line shaped pattern corresponding to the plurality of thin film transistors. The semiconductor layer 335 can have a line shaped pattern which is formed to be superimposed with the gate line 301, being outside of the corresponding pixel region 305, or which extends along the gate line 301 over the adjacent pixel region 305a.

Figure 8C:
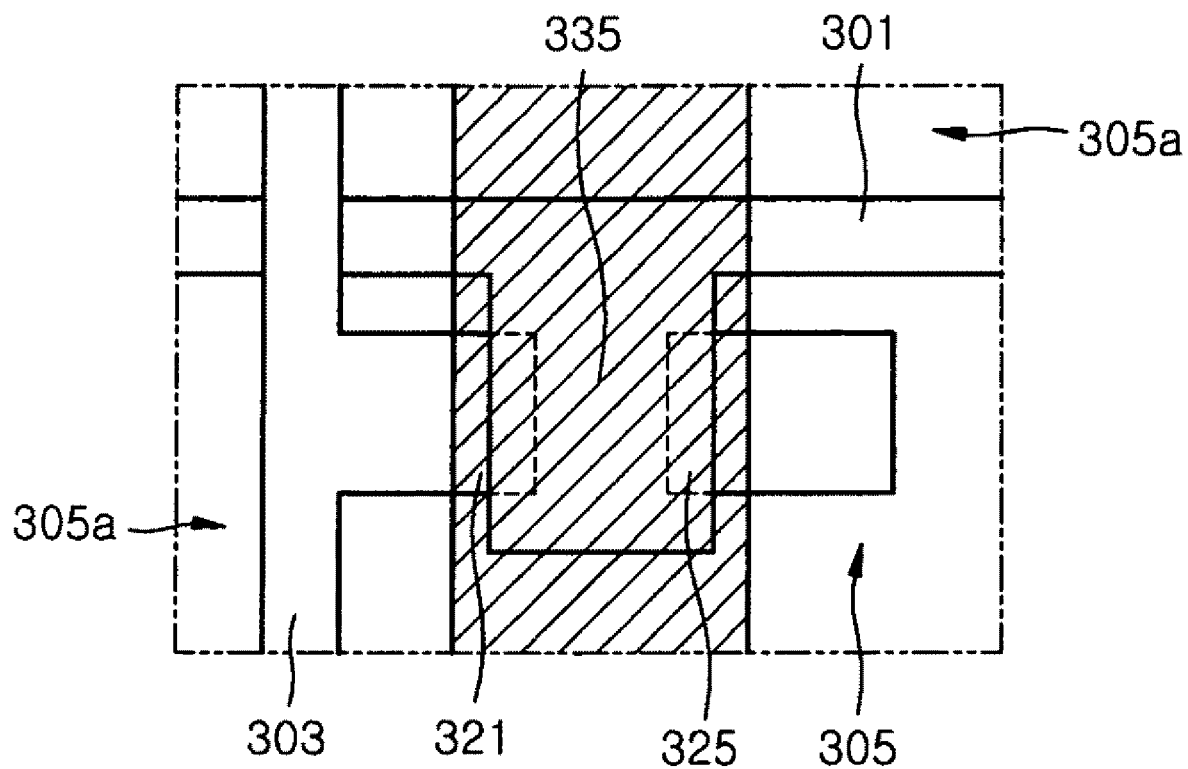

Referring now to FIG. 8C, the semiconductor layer 335 has a line shape extending to correspond to pixel regions arranged in the second direction, for example in a column direction (up and down), among the plurality of pixel regions defined by the gate line 301 and the data line 303. The semiconductor layer 335 is formed to be separate from thin film transistors arranged in a pixel regions 305a arranged in an adjacent column among the plurality of pixel regions. When a plurality of thin film transistors are arranged in the pixel region 305, the semiconductor layer 335 has a line-shaped pattern corresponding to each of the plurality of thin film transistors, or a line-shaped pattern corresponding to the plurality of thin film transistors. The semiconductor layer 335 can have a line-shaped pattern which is formed to be superimposed with the data line 303, being outside of the corresponding pixel region 305, or which extends along the data line 303 over the adjacent pixel region 305a.

Figure 8D:
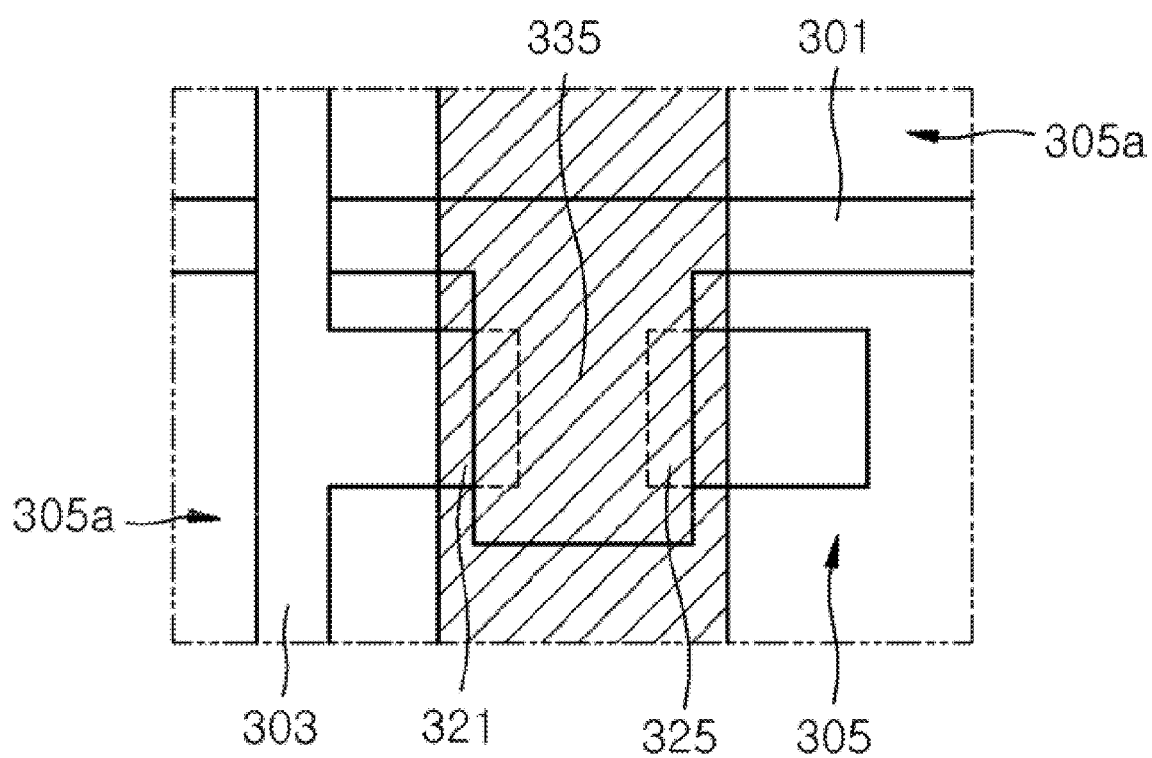

Referring now to FIG. 8D, the semiconductor layer 335 has a mesh shape corresponding to pixel regions 305 arranged in row and column (i.e., second and first) directions among the plurality of pixel regions defined by the gate line 301 and the data line 303. The semiconductor layer 335 is formed along the data line 303 and the gate line 301 in a portion corresponding to the plurality of pixel regions. When a plurality of thin film transistors are arranged in the pixel region, the semiconductor layer 335 has a mesh-shaped pattern corresponding to each of the plurality of thin film transistors, or a mesh-shaped pattern corresponding to the plurality of thin film transistors. The semiconductor layer 335 can have a mesh shaped pattern which is formed to be superimposed with the gate line 301 and/or the data line 303, being outside of the corresponding pixel region 305, or which extends along the gate line 301 and the data line 303 over the adjacent pixel region 305a.

Figure 9A:
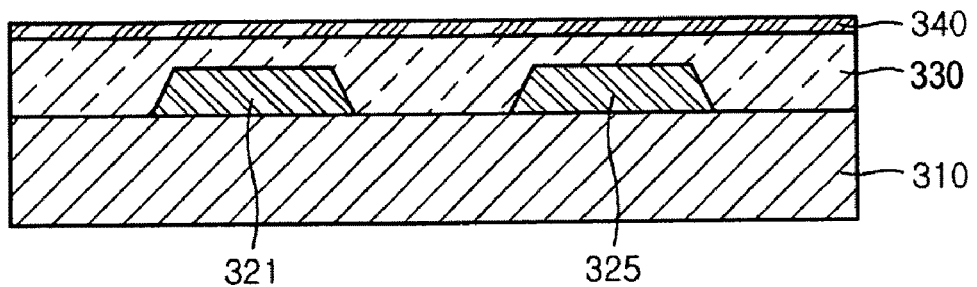
FIGS. 9A through 9D are cross-sectional views for explaining a method of fabricating the organic thin film transistor of FIG. 7.

Turning now to FIGS. 9A through 9D, FIGS. 9A through 9D are cross-sectional views for explaining a method of fabricating the organic thin film transistor 300 of FIG. 7. Referring to FIG. 9A, the source and drain electrodes 321 and 325 are formed on the substrate 310, and organic semiconductor material 330 is formed on the entire surface of the substrate 310 covering the source and the drain electrodes 321 and 325. A photosensitive material 340 for the protective film is formed on the semiconductor material 330. The substrate 310 can be one of a glass substrate, a plastic substrate, and a metal substrate.

Figure 9B:
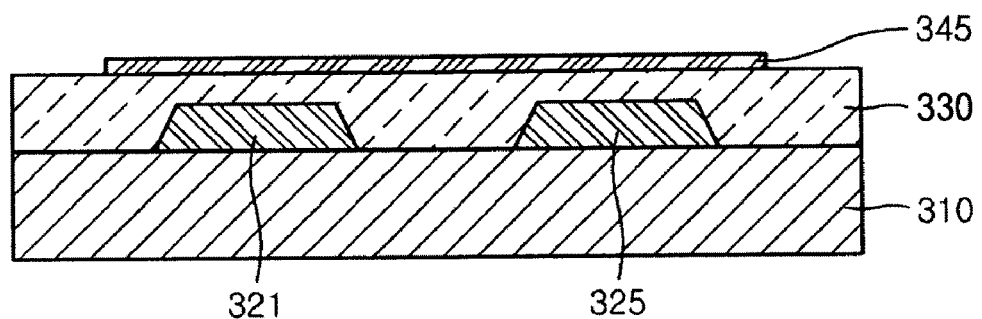

Referring now to FIG. 9B, the photosensitive material 340 is exposed and developed and patterned to become protective film 345 so that a portion of the protective film 345 remains over the source and drain electrodes 321 and 325 and the space between the source and drain electrodes 321 and 325. The remaining protective film 345 serves to protect the underlying organic semiconductor material 330 during the subsequent dry etching process.

Figure 9C:
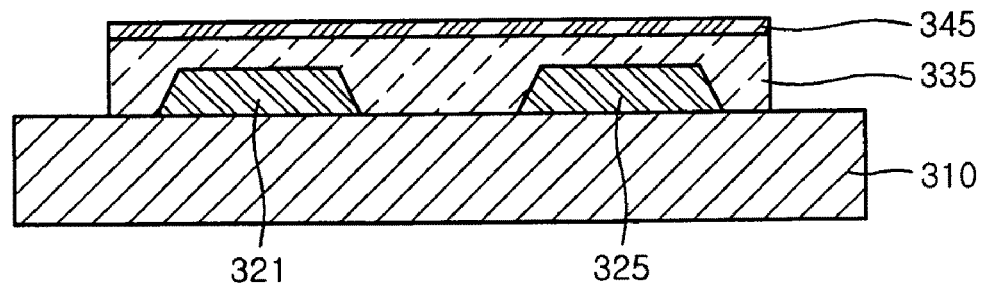

Referring now to FIG. 9C, the exposed portion of the organic semiconductor material 330 is dry etched using the protective film 345 as an etch mask to produce a semiconductor layer 335. The semiconductor layer 335 is patterned to have various patterns as illustrated in FIGS. 8A through 8D.

Figure 9D:
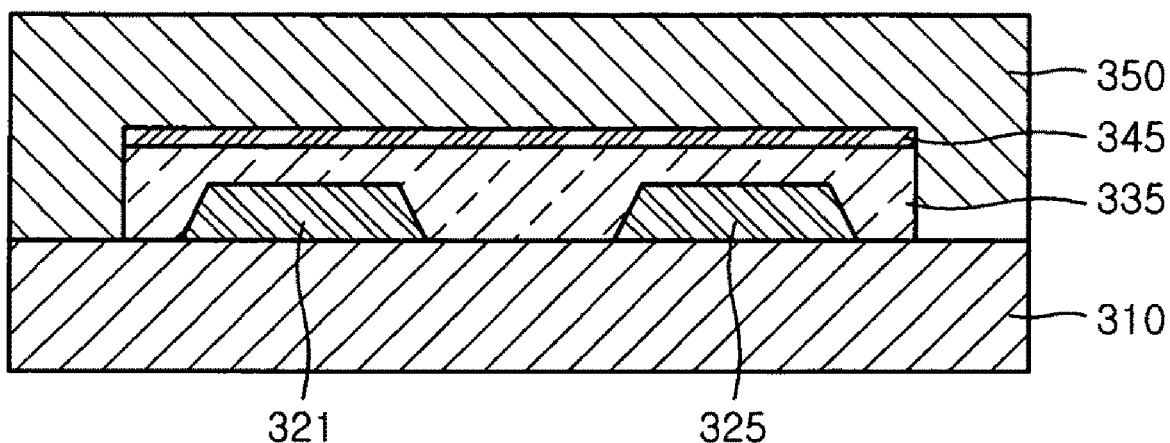

Referring now to FIG. 9D, a gate insulating film 350 is formed on the resultant structure and a gate electrode 355 (not shown in FIG. 9D) is formed on the gate insulating film 350 to form the organic thin film transistor 300 of FIG. 7.

Figure 10:
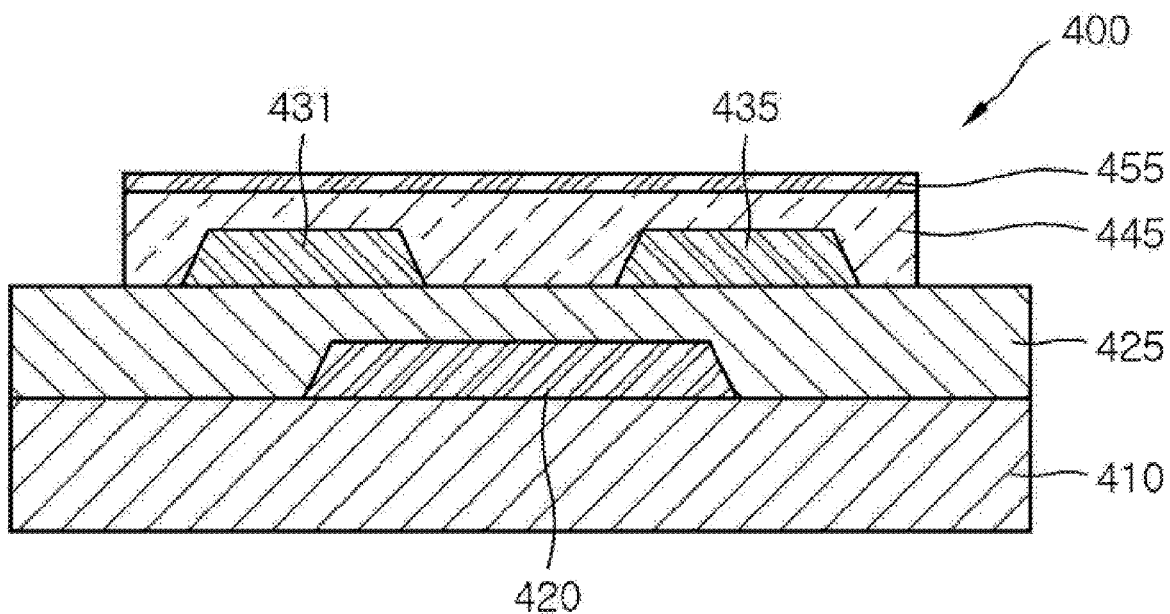
FIG. 10 is a cross-sectional view illustrating an organic thin film transistor according to a fourth embodiment of the present invention.

Turning now to FIG. 10, FIG. 10 is a cross-sectional view illustrating an organic thin film transistor 400 according to a fourth embodiment of the present invention. The organic thin film transistor 400 is a bottom gate structure type thin film transistor. Referring now to FIG. 10, a gate electrode 420 is formed on a substrate 410, and a gate insulating film 425 is formed on the gate electrode 420 and on the substrate 410. Source and drain electrodes 431 and 435 are formed on the gate insulating film 425. A semiconductor layer 445 is formed on the source and drain electrodes 431 and 435 and a protective film 455 is formed on a semiconductor layer 445. Like the thin film transistor 300 of FIG. 7, the substrate 410 can be one of a glass substrate, a plastic substrate or a metal substrate. The gate insulating film 420 can have one or more layers, each layer being either an organic insulating film, an inorganic insulating film or an organic-inorganic hybrid film. The semiconductor layer 445 is an organic semiconductor layer. The protective film 455 includes positive or negative photosensitive material.

The method of fabricating the organic thin film transistor 400 of FIG. 10 includes patterning the semiconductor layer 445 using the patterned protective film 455 as an etch mask and is similar to the method of fabricating the organic thin film transistor 300 of FIG. 7. That is, the gate 420, the gate insulating film 425, and the source and drain electrodes 431 and 435 are formed on the substrate 410. Then, an organic semiconductor material and a photosensitive material are formed on the substrate 410. Next, the photosensitive material is exposed, developed and patterned to produce patterned protective film 455. The patterned protective film 455 and an etch mask during the dry etch patterning of the underlying semiconductor layer 445. The organic semiconductor material is then patterned, thus forming the semiconductor layer 445.

According to the fourth embodiment of FIG. 10, the semiconductor layer 445 is patterned using a dry etching process with the protective film 455 as illustrated in FIG. 9A through 9D, so that surface damage of the semiconductor layer 445 can be prevented and carrier accumulation is prevented, thus reducing the turn-off current of the transistor.

Figure 11:
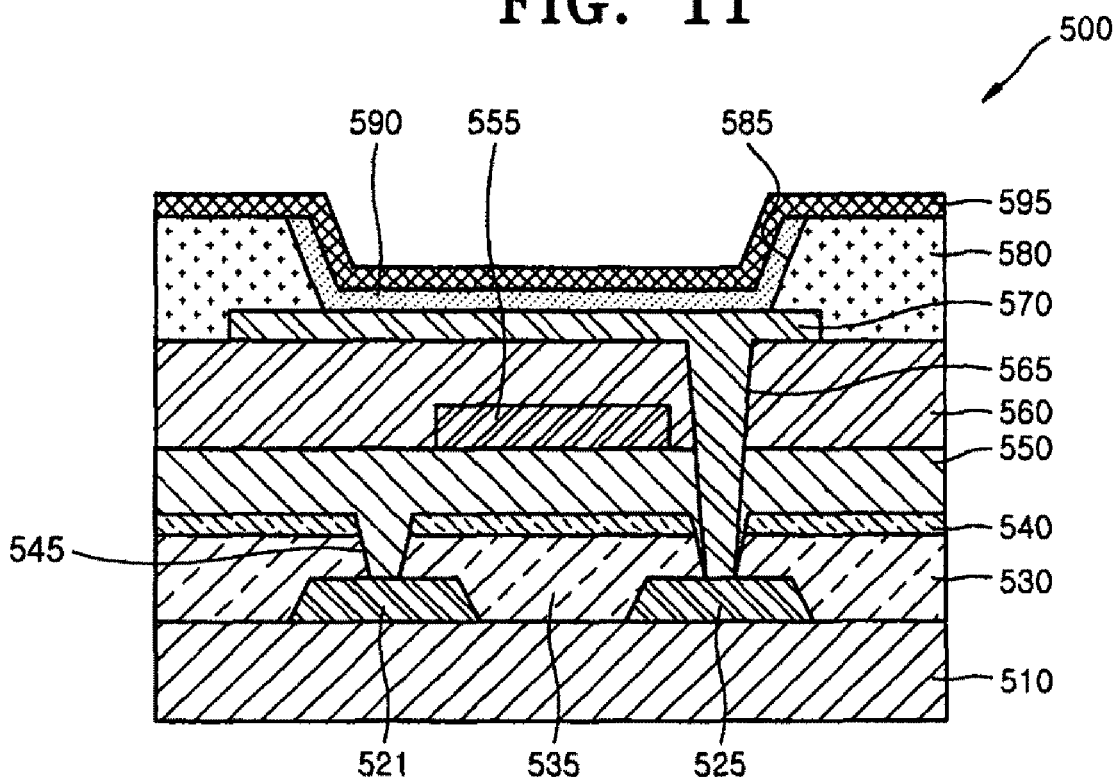
FIG. 11 is a cross-sectional view illustrating an organic electro-luminescence display device having an organic thin film transistor according to an embodiment of the present invention.

Turning now to FIG. 11, FIG. 11 is a cross-sectional view illustrating an organic electro-luminescence display 500 having a top gate type organic thin film transistor similar to the organic thin film transistor 100 of FIG. 3 according to an embodiment of the present invention. FIG. 11 corresponds to a single pixel and illustrates an organic light-emitting device and a driving thin film transistor driving the organic light-emitting device in a single pixel of the organic electro-luminescence display 500.

Since the structure of the transistor part of display 500 is similar to that of transistor 100 of FIG. 3, the method of making the transistor portion of display 500 is similar to that of FIGS. 5A through 5D. Referring now to FIG. 11, source and drain electrodes 521 and 525 are formed on a substrate 510. A semiconductor layer 530 is formed on the substrate 510 and on the source and the drain electrodes 521 and 525 to contact the source and drain electrodes 521 and 525. A protective film 540 is then formed on the semiconductor layer 530. A separation pattern 545 defining a channel region 535 is formed in the semiconductor layer 530 and in the protective film 540 to separate adjacent channel layers of the thin film transistor (not illustrated). A gate insulating film 550 is formed on the resultant structure, and a gate electrode 555 is formed on the gate insulating film 550.

The substrate 510 can be one of a glass substrate, a plastic substrate, and a metal substrate. The semiconductor layer 530 is an organic semiconductor material. The gate insulating film 550 can have one or more layers, each layer being either an organic insulating film, an inorganic insulating film or an organic-inorganic hybrid film. The protective film 540 protects the surface of the channel region 535 when patterning the semiconductor layer 530 to form the separation pattern 545 defining the channel region 535. The semiconductor layer 530 has the same groove pattern as the groove patterns in the semiconductor layer 130 illustrated in FIGS. 4A through 4D.

The protective film 540 can be an organic insulating film, an inorganic insulating film, or an organic-inorganic hybrid film, and include one of silicon oxide, silicon nitride, polyvinyl alcohol (PVA), polyvinyl chloride (PVC), polymethylmethacrylate (PMMA), polyimide, parylene, polyvinyl phenol (PVP), and PI/Al$_2$O$_3$. In addition, the protective film 540 can include a negative or positive photosensitive material. The protective film 540 is formed to be thinner than the semiconductor layer 530, and can have a thickness of less than 1000 Å, for example, 10 to 1000 Å.

The protective film 540 can be formed of a fluoride-based polymer, which does not have a significant effect on the underlying semiconductor layer 530. Since the fluoride-based polymer has a low dielectric constant, the gate insulating film 550 can be formed of a material having a high dielectric constant. The gate insulating film 550 can include a high-k inorganic insulating film such as Ta$_2$O$_5$, Y$_2$O$_3$, TiO$_2$, BST, PZT, and BZT. The gate electrode 555 is then formed on the gate insulating film.

A passivation film 560 is formed on the gate electrode 555 and on the gate insulating film 550. A lower electrode 570 of the organic light-emitting device is formed on the passivation film 560. A pixel separation film 580 is formed on the passivation film 560. The lower electrode 570 is connected to the drain electrode through a via 565. The pixel separation film 580 includes an aperture 585 exposing a portion of the lower electrode 570. An organic film layer 590 is formed on a portion of the lower electrode 570 exposed by the aperture 585. An upper electrode 595 is formed on the organic film layer 590 and on the pixel separation film 580. The organic film layer 590 can include one or more organic layers such as a hole injection layer, a hole transport layer, a light emission layer, an electron transport layer, an electron injection layer, and an hole blocking layer.

Figure 12:
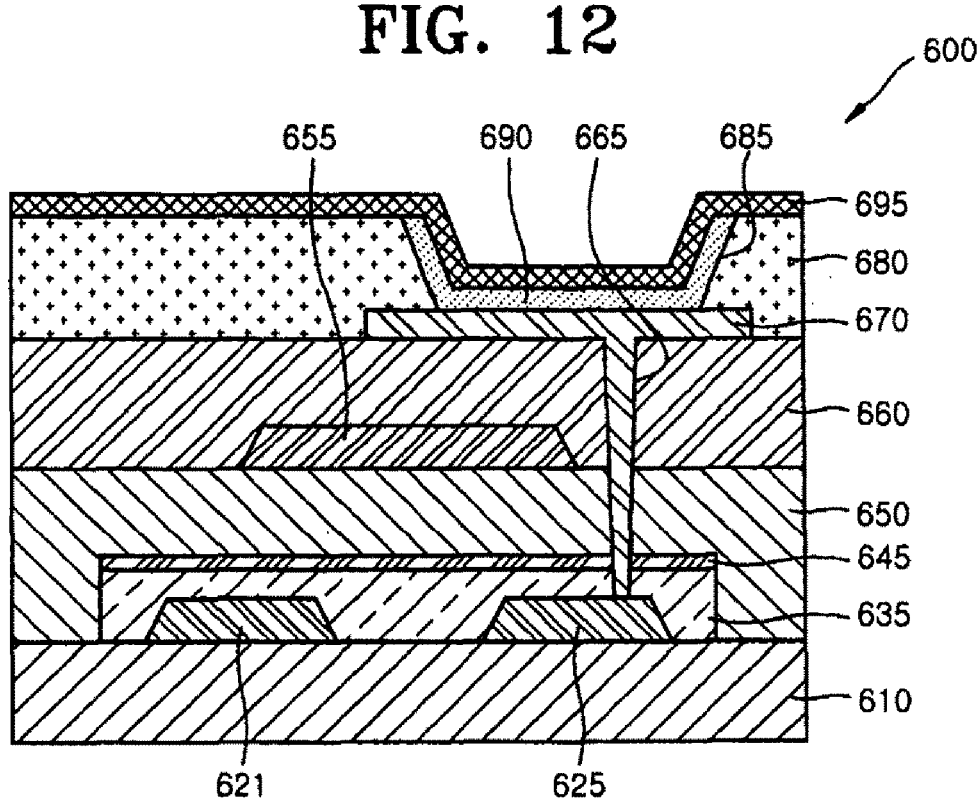
FIG. 12 is a cross-sectional view illustrating an organic electro-luminescence display device having an organic thin film transistor according to another embodiment of the present invention.

Turning now to FIG. 12, FIG. 12 is a cross-sectional view illustrating an organic electro-luminescence display 600 having a top gate type structure of an organic thin film transistor according to another embodiment of the present invention. FIG. 12 corresponds to a single pixel and illustrates an organic light-emitting device and a driving thin film transistor driving the organic light-emitting device in a single pixel of the organic electro-luminescence display 600. In display 600 of FIG. 12, the transistor portion is similar to that of transistor 300 of FIG. 7.

In forming display 600, since the transistor portion of display 600 is similar to that of transistor 300 of FIG. 7, the method of making the transistor portion of display 600 is similar to that of FIGS. 9A through 9D. Referring now to FIG. 12, source and drain electrodes 621 and 625 are formed on a substrate 610, and a semiconductor layer 635 and a protective film 645 are formed over the source and drain electrodes 621 and 625. The semiconductor layer 635 and the protective film 645 are patterned to produce separate from channel layers for adjacent thin film transistors (not illustrated). A gate insulating film 650 is formed on the resultant structure, and a gate electrode 655 is formed on the gate insulating film 650.

The substrate 610 can be one of a glass substrate, a plastic substrate, and a metal substrate. The semiconductor layer 635 is an organic semiconductor layer. The gate insulating film 650 can have one or many layers, each layer being either an organic insulating film, an inorganic insulating film or an organic-inorganic hybrid film.

The protective film 645 serves as an etch mask and protects the surface of the semiconductor layer 635 when patterning the semiconductor layer 635 via dry etching. The semiconductor layer 635 has a groove pattern similar to the semiconductor pattern 335 illustrated in FIGS. 8A through 8D. The protective film 645 includes a negative or positive photosensitive material. The protective film 645 is formed to be thinner than the semiconductor layer 635, and can have a thickness of less than 1000 Å, for example, 10 to 1000 Å.

A passivation film 660 is formed on the resultant structure, a pixel separation film 680, a lower electrode 670, an organic film layer 690, and an upper electrode 695 of the organic light-emitting device are formed on the passivation film 660. The lower electrode 670 is connected to the drain electrode 625 through a via 665. The pixel separation film 680 is perforated by an aperture 685 that exposes a portion of the lower electrode 670.

In the embodiments of FIGS. 11 and 12, the organic electro-luminescence display includes the thin film transistors having the top gate structure as illustrated in FIG. 3 and 7 respectively, but the present embodiments of FIGS. 11 and 12 can just as well be applied to an organic electro-luminescence display including the thin film transistors having the bottom gate structure as illustrated in FIG. 6 and 10 respectively.

The organic thin film transistor and the organic electro-luminescence display employing the same is not limited to the structures illustrated in the drawings according to the embodiments of the present invention, and thus can be applied to any structure in which a semiconductor layer is patterned using a protective film to separate out a channel layer of a thin film transistor from channel layers of adjacent thin film transistors.

The organic electro-luminescence display having an organic thin film transistor as a switching device has been described, but the present invention is not limited thereto. For example, the present invention can also be applied to a flat panel display using an organic thin film transistor as a switching device so that the turn-off current of the thin film transistor can be reduced and the surface damage of the organic semiconductor layer can be prevented.

According to the present invention, the semiconductor layer is patterned using a laser ablation method so that surface damage of the organic semiconductor layer can be prevented and carrier accumulation is prevented, thereby reducing the turn-off current of the transistor.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A method, comprising:
providing a thin film transistor that includes gate, source and drain electrodes and a semiconductor layer;
forming the semiconductor layer on a substrate;
forming a protective film on the semiconductor layer, the protective film including a laser-absorbing material; and
patterning the semiconductor layer and the protective film via a laser ablation process to produce a separation pattern defining a channel region of the semiconductor layer, the separation pattern being arranged within the semiconductor layer and within the protective film, the separation pattern having a shape, in a plane parallel to the substrate, selected from a group consisting of a box shape and a mesh shape.

2. The method of claim 1, wherein the protective film is thinner than the semiconductor layer and has a thickness of 10 to 1000 Å.

3. The method of claim 1, wherein the protective film comprises a fluoride-based polymer, and the gate insulating film comprises a high dielectric constant (high-k) material selected from a group consisting of $Ta_2O_5$, $Y_2O_3$, $TiO_2$, barium strontium titanate (BST), lead zirconate titanate (PZT), and barium zirconate titanate (BZT).

4. The method of claim 1, wherein either the gate, the gate insulating film, and the source and drain electrodes are formed prior to said forming of the semiconductor layer or the source and drain electrodes are formed before forming the semiconductor layer, the semiconductor layer is then patterned, and then the gate insulating film and the gate electrode are formed.

5. The method of claim 1, separation pattern being box-shaped.

6. The method of claim 1, the separation pattern being mesh-shaped.

7. A method, comprising:
  providing a substrate;
  forming source and drain electrodes on the substrate;
  forming the semiconductor layer on a substrate;
  forming a protective film on the semiconductor layer, the protective film including a laser-absorbing material; and
  patterning the semiconductor layer and the protective film via a laser ablation process to produce a separation pattern defining a channel region of the semiconductor layer, the separation pattern being arranged within the semiconductor layer and within the protective film, the separation pattern having a shape, in a plane parallel to the substrate, selected from a group consisting of a box shape and a mesh shape.

8. The method of claim 7, the separation pattern being a groove.

9. The method of claim 7, the protective film being an organic material that includes an aromatic material that absorbs light.

10. The method of claim 7, the semiconductor layer being an organic semiconductor layer.

11. The method of claim 7, further comprising:
  forming a gate insulating layer on the patterned protective film; and
  forming a gate electrode on the gate insulating layer at a location corresponding to the channel region of the semiconductor layer.

\* \* \* \* \*